(12) United States Patent
Rasmussen

(10) Patent No.: US 10,707,869 B2
(45) Date of Patent: Jul. 7, 2020

(54) INSULATED JOYSTICK

(71) Applicant: Altec Industries, Inc., Birmingham, AL (US)

(72) Inventor: Corey Rasmussen, Durham, NC (US)

(73) Assignee: Altec Industries, Inc., Birmingham, AL (US)

( * ) Notice: Subject to any disclaimer, the term of this patent is extended or adjusted under 35 U.S.C. 154(b) by 120 days.

(21) Appl. No.: 15/598,494

(22) Filed: May 18, 2017

(65) Prior Publication Data

US 2018/0337674 A1 Nov. 22, 2018

(51) Int. Cl.
| | |
|---|---|
| *H03K 17/965* | (2006.01) |
| *G05G 1/06* | (2006.01) |
| *G05G 25/00* | (2006.01) |
| *B66F 11/04* | (2006.01) |
| *B66F 17/00* | (2006.01) |

(52) U.S. Cl.
CPC .......... *H03K 17/965* (2013.01); *B66F 11/044* (2013.01); *B66F 17/006* (2013.01); *G05G 1/06* (2013.01); *G05G 25/00* (2013.01)

(58) Field of Classification Search
CPC .......... G06F 1/169; G06F 3/033; G05G 1/06; G05G 25/00; H03K 17/965; B66F 11/044; B66F 17/006
USPC .............. 74/469, 174, 471 R; 345/161, 167; 180/315, 324
See application file for complete search history.

(56) References Cited

U.S. PATENT DOCUMENTS

| | | | | |
|---|---|---|---|---|
| 4,211,935 A | * | 7/1980 | Erben | H03K 17/965 200/81.4 |
| 4,375,631 A | * | 3/1983 | Goldberg | G05G 9/047 338/128 |
| 4,445,541 A | * | 5/1984 | Schmiel | F15B 13/0424 137/596.12 |
| 4,459,440 A | * | 7/1984 | Wiczer | G05G 9/04796 200/246 |
| 4,469,330 A | * | 9/1984 | Asher | A63F 13/06 463/38 |
| 5,107,955 A | * | 4/1992 | Kishi | B66F 11/046 182/14 |
| 5,675,359 A | * | 10/1997 | Anderson | G05G 9/047 200/6 R |
| 5,724,068 A | * | 3/1998 | Sanchez | G05G 9/047 345/161 |

(Continued)

OTHER PUBLICATIONS

MJ3 Miniature Force Joysticks; DACO hand controllers; Date Printed: Aug. 30, 2017; Date Posted: Unknown; <http://www.daco.co.uk/images/DACO_Force.pdf>.

*Primary Examiner* — David R Dunn
*Assistant Examiner* — Shiref M Mekhaeil
(74) *Attorney, Agent, or Firm* — Erise IP, P.A.

(57) ABSTRACT

An insulated joystick for use in an insulated environment, such as on an insulated aerial device. The insulated joystick includes an inner assembly segment, a mobile sensor, and an outer protective segment. The inner assembly segment presents a sensor void and is formed of a dielectric material. The mobile sensor is disposed at least partially within the sensor void. The mobile sensor is configured to detect a movement of the insulated joystick by a user. The outer protective segment disposed at least partially around the inner assembly segment and is formed of a dielectric material.

19 Claims, 8 Drawing Sheets

(56) References Cited

U.S. PATENT DOCUMENTS

| | | | | |
|---|---|---|---|---|
| 5,831,554 A * | 11/1998 | Hedayat | ............... | G05G 9/047 341/20 |
| 6,160,537 A * | 12/2000 | Liu | ............... | G05G 1/06 250/221 |
| 6,177,640 B1 * | 1/2001 | Okabe | ............... | G05G 9/047 200/6 A |
| 6,359,614 B1 * | 3/2002 | McVicar | ............... | G05G 1/06 273/148 B |
| 6,429,849 B1 * | 8/2002 | An | ............... | G05G 9/047 345/161 |
| 6,867,379 B2 * | 3/2005 | Hayashi | ............... | G05G 1/08 200/4 |
| 6,892,481 B2 * | 5/2005 | Yamamoto | ............... | E02F 9/2004 324/207.2 |
| 7,592,562 B1 * | 9/2009 | Vanderwege | ............... | H01H 3/20 200/336 |
| 8,763,746 B2 * | 7/2014 | Tozuka | ............... | H01H 9/06 180/315 |
| 9,149,670 B1 | 10/2015 | Walker | ............... | A62B 35/0068 |
| 2002/0024503 A1 * | 2/2002 | Armstrong | ............... | G05G 9/047 345/167 |
| 2002/0084984 A1 * | 7/2002 | Beinor | ............... | G05G 9/047 345/161 |
| 2003/0058219 A1 * | 3/2003 | Shaw | ............... | G06F 3/0338 345/161 |
| 2003/0107502 A1 * | 6/2003 | Alexander | ............... | G05G 9/047 341/34 |
| 2006/0117891 A1 * | 6/2006 | Ichiki | ............... | E02F 9/2004 74/471 XY |
| 2006/0125790 A1 * | 6/2006 | Edmunds | ............... | G05G 9/047 345/161 |
| 2006/0274040 A1 * | 12/2006 | Passaro | ............... | G05G 9/047 345/161 |
| 2007/0164996 A1 * | 7/2007 | Gould | ............... | G05G 5/005 345/161 |
| 2008/0183038 A1 * | 7/2008 | Tilson | ............... | A61B 1/018 600/104 |
| 2010/0201622 A1 * | 8/2010 | Jaouen | ............... | G05G 9/047 345/161 |
| 2010/0302017 A1 * | 12/2010 | Guglielmo | ............... | G05G 9/047 340/407.2 |
| 2011/0088970 A1 * | 4/2011 | Beji | ............... | B66F 11/046 182/18 |
| 2011/0202236 A1 * | 8/2011 | Galasso | ............... | B62K 25/04 701/37 |
| 2012/0165780 A1 * | 6/2012 | Bazargan | ............... | A61M 5/00 604/500 |
| 2012/0260763 A1 * | 10/2012 | Terao | ............... | G05G 1/08 74/507 |
| 2013/0012322 A1 * | 1/2013 | Pena | ............... | A63F 13/24 463/38 |
| 2014/0024110 A1 * | 1/2014 | Knofe | ............... | B25J 13/02 435/325 |
| 2014/0062219 A1 * | 3/2014 | Saitou | ............... | H03K 17/965 307/116 |
| 2014/0093345 A1 * | 4/2014 | Nakazawa | ............... | B62D 11/04 414/728 |
| 2014/0179177 A1 * | 6/2014 | Hitachi | ............... | B63H 25/42 440/1 |
| 2014/0251070 A1 * | 9/2014 | Kornelson | ............... | G05G 5/06 74/523 |
| 2014/0332314 A1 * | 11/2014 | Carrillo | ............... | B66F 11/04 182/19 |
| 2016/0049849 A1 * | 2/2016 | Boger | ............... | H02K 7/1823 182/129 |
| 2016/0077543 A1 * | 3/2016 | Conro | ............... | G05G 9/047 74/471 XY |
| 2016/0109256 A1 * | 4/2016 | Kumon | ............... | G01C 21/3664 701/532 |
| 2016/0179128 A1 * | 6/2016 | Guglielmo | ............... | B66F 11/04 182/19 |
| 2017/0001106 A1 * | 1/2017 | Gassoway | ............... | A63F 13/24 |
| 2017/0241155 A1 * | 8/2017 | Johnson | ............... | B66F 11/046 |
| 2017/0246533 A1 * | 8/2017 | LaChappelle | ............... | G05G 9/047 |
| 2017/0277282 A1 * | 9/2017 | Go | ............... | G06F 1/1694 |
| 2017/0283229 A1 * | 10/2017 | Shi | ............... | B66F 17/006 |
| 2018/0043929 A1 * | 2/2018 | Takenaka | ............... | B62D 5/06 |
| 2018/0105203 A1 * | 4/2018 | Takenaka | ............... | B62D 5/065 |
| 2019/0066884 A1 * | 2/2019 | Gorghuber | ............... | H01B 17/005 |

* cited by examiner

INSULATED JOYSTICK

BACKGROUND

1. Field

Embodiments of the invention relate to the control of utility platforms associated with aerial devices. More specifically, embodiments of the invention relate to insulated joysticks.

2. Related Art

Utility workers utilize a utility vehicle to reach inaccessible locations. The utility vehicle generally includes a boom with a utility platform. The utility worker stands in the elevated utility platform while performing a task. Electric utility workers typically use a utility vehicle to access overhead electric power lines and electric power components for installation, repair, or maintenance. The utility platforms utilized by electric utility workers are highly insulated so as to prevent the discharge of electricity through the utility vehicle, and especially through the utility worker.

Due to the insulated nature in the utility platform, joysticks that control the movement of the utility platform have been heavily insulated in the prior art. These joysticks of the prior art are a standard metal joystick that have added insulation to prevent the user from directly grasping the metal. This insulation increases the size and bulkiness of the joystick. The added insulation is also prone to wear, dislocation, and other dangerous conditions.

SUMMARY

Embodiments of the invention solve the above-mentioned problems by providing an insulated joystick that does not rely on added insulation to prevent electrical discharge. The insulated joystick provides increased dielectric strength by further separating the user's hand from the internal electronic sensors that detect the movement of the insulated joystick. Embodiments of the invention therefore provide a smaller, more comfortably sized joystick that is less prone to wear and provides better dielectric protection to the user.

A first embodiment of the invention is directed to an insulated joystick comprising an inner assembly segment, a mobile sensor, and an outer protective segment. The inner assembly segment presents a sensor void and is formed of a dielectric material. The mobile sensor is disposed at least partially within the sensor void. The mobile sensor is configured to detect a movement of the insulated joystick by a user. The outer protective segment disposed at least partially around the inner assembly segment and is formed of a dielectric material.

A second embodiment of the invention is directed to an aerial device that is at least partially insulated. The aerial device comprises a base, a boom assembly, a utility platform assembly, and an insulated joystick. The boom assembly presents a proximal end and a distal end. The boom assembly is pivotably secured to the base at the proximal end. The utility platform assembly is pivotably secured to the distal end of the boom assembly. The insulated joystick is configured to control movement of the utility platform assembly and the boom assembly. The insulated joystick comprises an inner assembly segment, a mobile sensor, and an outer protective segment. The inner assembly segment presents a sensor void and is formed of a dielectric material. The mobile sensor is disposed at least partially within the sensor void. The mobile sensor is configured to detect a movement of the insulated joystick by a user. The outer protective segment disposed at least partially around the inner assembly segment and is formed of a dielectric material.

A third embodiment of the invention is directed to a method of assembling an insulated joystick, the method comprising the following steps: inserting a traversing rod at least partially into an inner assembly segment; inserting a mobile sensor at least partially into the inner assembly segment, wherein the mobile sensor is configured to detect movement of the inner assembly segment relative to the traversing rod; and sliding an outer protect segment at least partially over the inner assembly segment so as to insulate the mobile sensor.

Another embodiment of the invention may be directed to a utility platform assembly comprising a utility platform, a set of upper boom control, and an insulated joystick. Still another embodiment of the invention may be directed to an insulated joystick comprising a static segment and a mobile segment 54. A traversing rod of the mobile segment 54 is pivotably secured to the static segment. The static segment is configured to be installed within a set of upper boom controls.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

Figure 1:
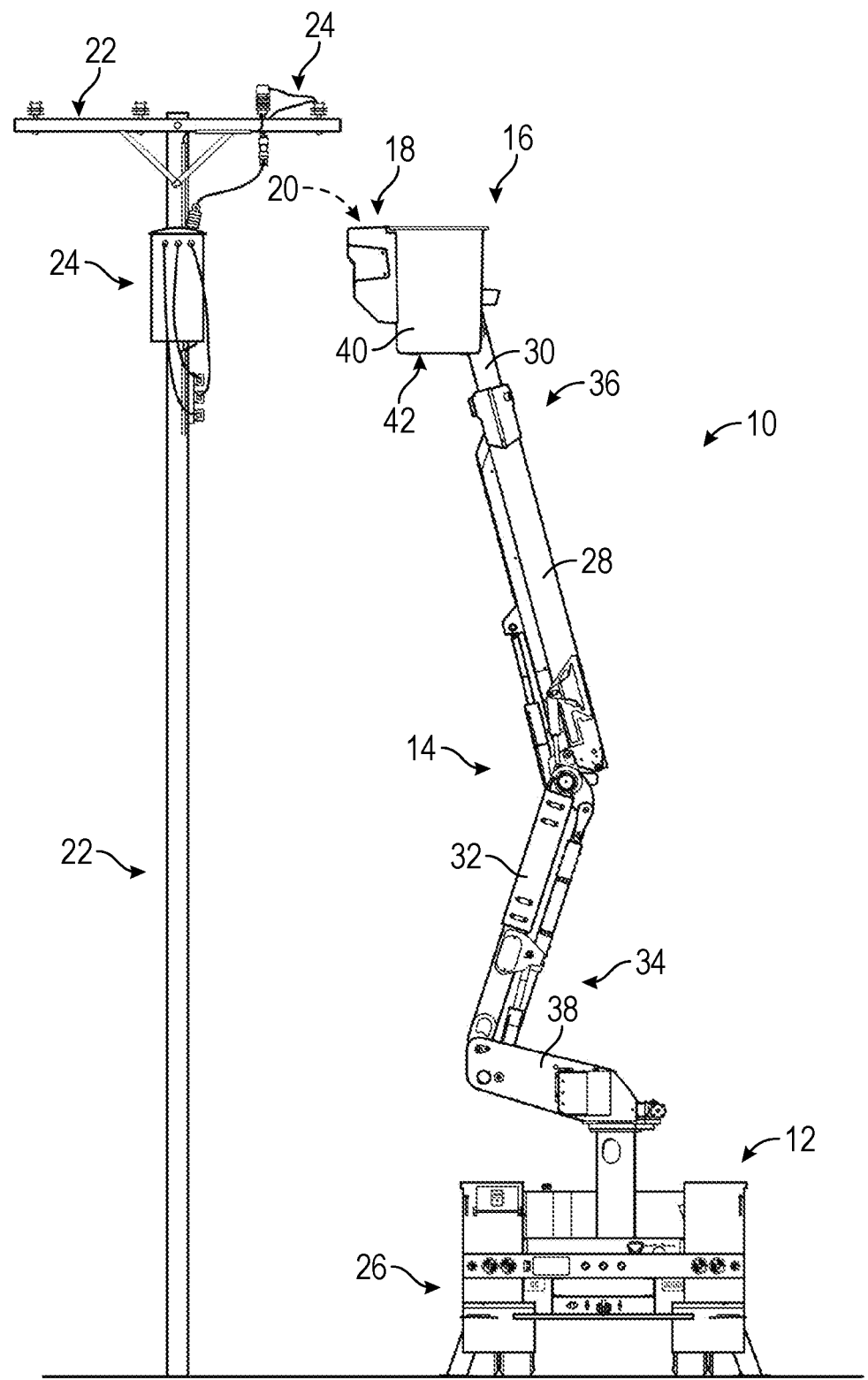
FIG. 1 is a rear view of an aerial device of embodiments of the invention.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the technology can include a variety of combinations and/or integrations of the embodiments described herein.

An aerial device 10, constructed in accordance with various embodiments of the invention, is shown in FIG. 1. The aerial device 10 generally comprises a base 12 with a boom assembly 14 rotatably mounted thereto. A utility platform assembly 16 is disposed on the boom assembly 14 to provide an aerial platform for the accomplishment of a task by a utility worker. The aerial device 10 further comprises a set of upper boom controls 18, which includes an insulated joystick 20 (illustrated in FIG. 2). The set of upper boom controls 18 is configured to allow a utility worker to manipulate the aerial device 10 toward and around obstacles 22 while preventing an electrical discharge through the aerial device 10 from an external electrified source 24.

The base 12 of the aerial device 10 is a selectively stabilized platform. In embodiments of the invention, the base 12 is a utility truck (as illustrated in FIG. 1), a crane base, an oil rig, an earth-working machine, or a fixed structure. The base 12 provides stability and a counterweight to a load being supported by the boom assembly 14. The base 12 may be grounded and/or otherwise in contact with the ground. As such, the base 12 is outside of an insulated environment (which is typically associated with the utility platform assembly 16).

The base 12 has an engine or other unconstrained power source 26. The power source 26 has a few primary functions, such as moving the base 12 and operating the boom assembly 14. In embodiments of the invention, the power source 26 is an internal combustion engine that rotates the wheels and/or track of the base 12 to move the base 12 to or around a worksite. In other embodiments, the power source 26 is a battery, a gasoline/electric hybrid, a turbine engine, or the like (not illustrated). In embodiments of the invention, the power source 26 provides power to hydraulic pumps and hydraulic brakes. The hydraulic pumps and brakes manipulate the boom assembly 14 via providing hydraulic power.

The boom assembly 14 broadly comprises a lower boom section 28 and at least one insulated upper boom section 30. It should be appreciated that the majority of the present disclosure is concerned with preventing electrical discharge from the insulated upped boom section 30, which will commonly be referred to as an insulated boom section because other boom sections may also be insulated for safety reasons. As illustrated in FIG. 1, some embodiments of the boom assembly 14 may further comprise at least one pivoting boom section 32.

The boom assembly 14 presents a proximal end 34 and a distal end 36. The proximal end 34 is rotatably and/or pivotably secured to a portion of the base 12, such as a boom turret 38. The distal end 36 is secured to the utility platform assembly 16. In some embodiments, the at least one upper boom section 30 is at least in part disposed within the lower boom section 28. The at least one upper boom section 30 telescopes to extend or retract into the lower boom section 28. The pivoting boom section 32 does not telescope out of any other boom section. Instead the pivoting boom section 32 rotates about the base 12, and the lower boom section 28 pivots and/or rotates relative to the pivoting boom section 32. The use of the pivoting boom section 32 allows the utility platform assembly 16 to reach certain areas and avoid obstacles 22 in the working environment.

Figure 2:
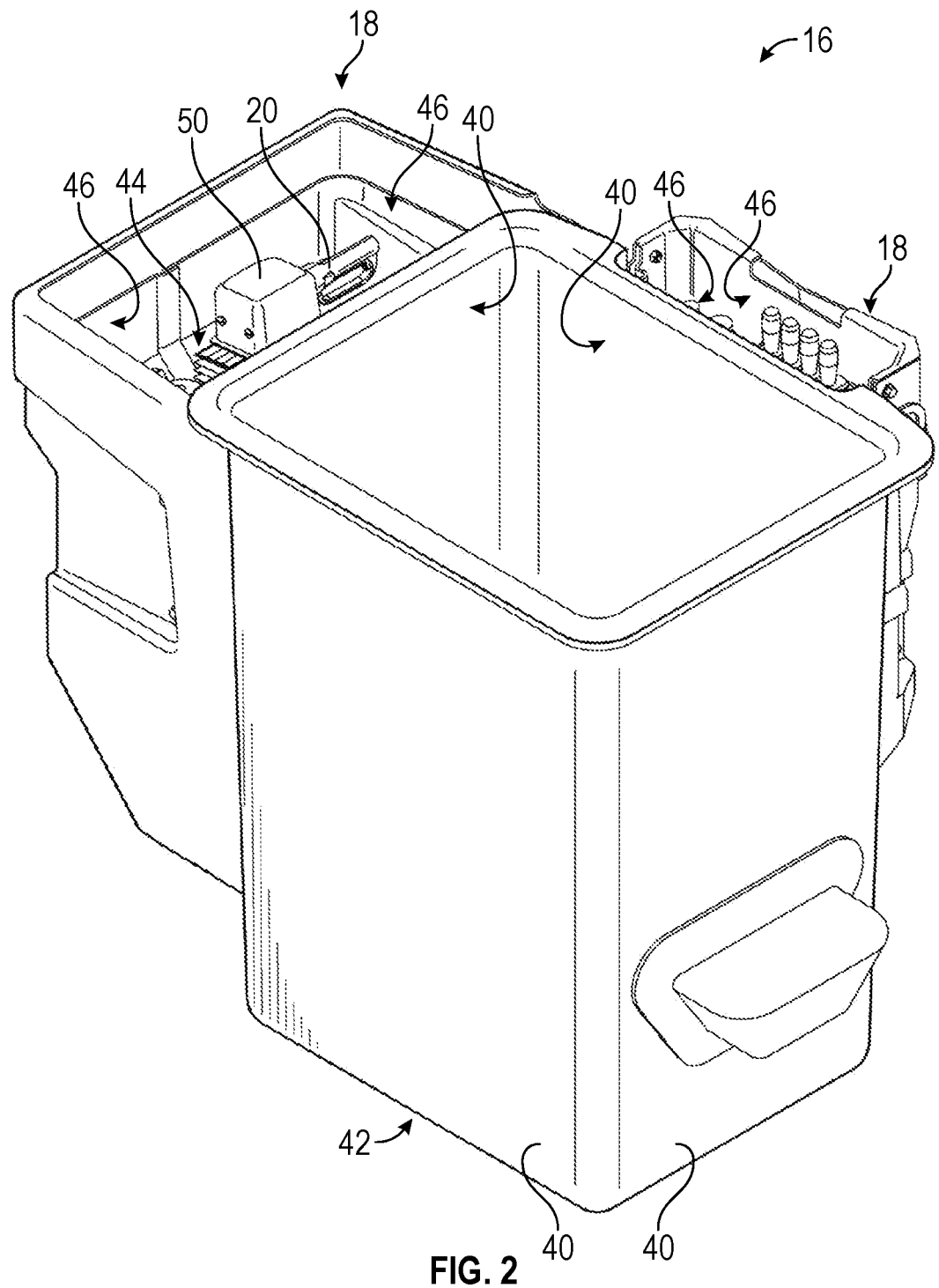
FIG. 2 is a perspective view of the aerial device of FIG. 1, which includes a set of upper boom controls and an insulated joystick.

Turning to FIG. 2, the utility platform assembly 16 provides an elevated surface from which at least one utility worker can perform a task. As illustrated in FIG. 2, embodiments of the utility platform assembly 16 comprise four bucket sidewalls 40 and a bucket floor 42 that collectively form a cavity. The utility platform assembly 16 may also present a bucket lip along a top portion of at least one bucket sidewall. The utility platform assembly 16 may further comprise a step and/or a door (not illustrated) in at least one of the bucket sidewalls 40 to allow for ingress and egress of the utility worker. The utility platform assembly 16 may also comprise a handrail (not illustrated). The four bucket sidewalls 40 and the bucket floor 42 of the utility platform assembly 16 form the cavity. The four bucket sidewalls 40 may be unitary, i.e. formed of a single monolithic structure, or they may be coupled together. The transition between successive bucket sidewalls 40, and/or between the bucket sidewalls 40 and the bucket floor 42, may be rounded or arcuate.

In some embodiments, the utility platform assembly 16 presents a horizontal cross-section that is substantially rectangular. Thus, two of the opposing bucket sidewalls 40 may have a greater width than the other two opposing bucket sidewalls 40. In other embodiments, the utility platform assembly 16 presents a horizontal cross-section that is substantially square, or another shape.

The set of upper boom controls 18 allows the operator to move the boom assembly 14 from within the utility platform assembly 16. The operator in the bucket has a better vantage point to know where and how to position the boom assembly 14 as opposed to the operator on the ground. Additionally, the set of upper boom controls 18 promotes efficiency by allowing the operator to directly control the movement of the boom assembly 14. In embodiments of the invention, an assistant operator (not illustrated) can access a set of lower boom controls (not illustrated) for the duration of the operator being in the utility platform assembly 16. This provides a safety backup to allow the assistant operator to remove the operator from a dangerous situation should the operator become incapacitated or there be a failure in the set of upper boom controls 18. The set of upper boom controls 18 may utilize the same or a different mechanism from the set of lower boom controls.

The set of upper boom controls 18 comprises a dash cover 44 and at least one input 46, as best illustrated in FIG. 2. In various embodiments of the invention, the input 46 can be a valve handle 48, the insulated joystick 20, a button (not illustrated), a switch (not illustrated), or a combination thereof. The dash cover 44 is generally flat or arcuate and presents at least one opening. Each of the at least one opening is situated around each of the at least one input 46. The dash cover 44 may additionally contain written instructions and safety information.

The dash cover 44 may include a joystick mount 50 that protrudes upward and/or outward from the dash cover 44. The joystick mount 50 allows the insulated joystick 20 to be positioned horizontally relative to the utility platform assembly 16. The horizontal orientation of the insulated joystick 20, as illustrated in FIG. 2, provides a more natural gripping orientation for the user and is less likely to snag on other debris and equipment. The joystick mount 50 may provide a stable platform relative to which at least a portion of the insulated joystick 20 is configured to move such that the user can input desired movement (and other command) information.

The insulated joystick 20 will now be discussed in more detail. The insulated joystick 20 is disposed in the set of upper boom controls 18 (as illustrated in FIG. 2) to control the movement of the utility platform assembly 16 relative to the distal end of the boom assembly 14 and/or the base 12. Some input commands may be interpreted as moving the utility platform assembly 16 relative to the boom assembly 14, moving the boom assembly 14 relative to the base 12, or both. For example, an instruction to move the utility platform assembly 16 away from the base 12 may be interpreted as requiring a lengthening of the boom assembly 14, a lowering of the boom assembly 14 angle relative to the base 12, and a raising of the utility platform assembly 16 relative to the boom assembly 14. These three distinct movements in each instructed by a single input into the controller.

In embodiments of the invention, the joystick is a multi-axis controller that receives input from the user about more than one axis. This is different than many prior art systems that include multiple single-axis controllers to produced complex movement. In these prior art systems, the user would have to move their hand from one joystick to another in order to move the utility platform assembly 16 in more than one direction. The multi-axis controller therefore simplifies the joystick into a more compact and intuitive design. The multi-axis controller includes a plurality of motion sensors each configured to detection motion of the insulated joystick 20 relative to the joystick mount 50, the set of upper boom controls 18, or other reference frame.

In some embodiments of the invention, the multi-axis controller is a four-axis controller. The four-axis controller is configured to detect four degrees of freedom of the insulated joystick 20. It should be appreciated that while much of the current disclosure pertains to a four-axis controller, embodiments of the invention, may be utilized in various insulated controllers of more or fewer axes. The utilized axes may also differ from those discussed below. The utilized axes may include any of the six traditional degrees of freedom, including the three translational axes (forward-backward, left-right, and up-down) and the three rotational axes (yaw, pitch, and roll). The utilized axes refer to detecting the movement of the joystick relative to the set of upper boom controls 18 or other relatively stationary component of the utility platform assembly 16.

For purposes of this disclosure, a reference system will be defined. The reference system relates to a miniature observer atop the insulated joystick 20 facing toward the joystick mount 50. Note, as discussed above, that in embodiments of the invention, the default position of the insulated joystick 20 is generally horizontal (as shown in FIG. 2). The axes of movement of the insulated joystick 20 are described from the perspective of the miniature observer. Various embodiments of the insulated joystick 20 may move forward and backward (e.g., toward and away from the joystick mount 50), left and right (e.g., laterally horizontally parallel to the joystick mount 50), up and down (e.g., laterally vertically parallel to the joystick mount 50), pitching (e.g., pivoting up and down), yawing (e.g., pivoting left and right), and/or rolling (e.g., pivoting about a central axis). It should be appreciated that this reference system is only exemplary and used to illustrate concepts to the user. In other embodiments of the invention, other reference systems may be used.

In embodiments of the invention, the insulated joystick 20 includes multi-axis control configured to detect movement of the insulated joystick 20 relative to the joystick mount 50 via a plurality of axes. The multi-axis controller includes at least one sensor for detecting the movement (as discussed below). An example of a multi-axis controller is a four-axis controller that is configured to detect four types of movement of the insulated joystick 20 relative to the joystick mount 50 of the set of upper boom controls 18. In the exemplary embodiment shown in the figures and discussed below, the four-axis controller associated with the insulated joystick 20 is configured to move in yaw, pitch, roll, and forward-backward. The four-axis controller detects each of these movements such that movements by the insulated joystick 20 may be translated into corresponding movements of the utility platform assembly 16.

Figure 3:
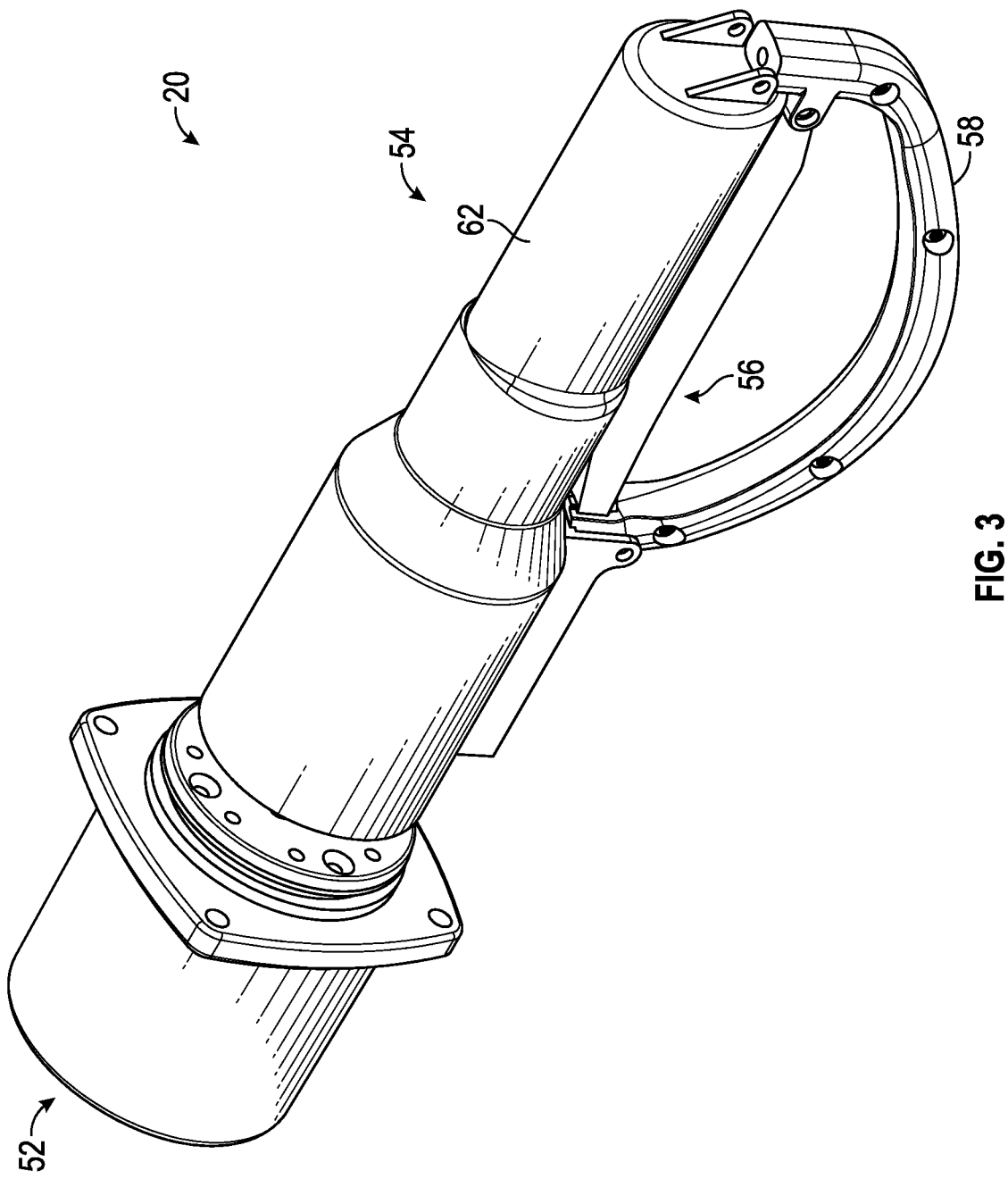
FIG. 3 is a perspective view of the insulated joystick.

The components of the insulated joystick 20, as best illustrated in FIGS. 3-8, will now be discussed in more detail. The insulated joystick 20 generally comprises a static segment 52 and a mobile segment 54, as illustrated in FIG. 3. The static segment 52 is secured to the joystick mount 50 (as illustrated in FIG. 2). The mobile segment 54 moves relative to the static segment 52. It is the movement of the mobile segment 54 relative to the static segment 52 that is detected of the multi-axis controller. It should be appreciated that in some embodiments of the invention, the below-discussed sensors of the multi-axis controller may be disposed within the static segment 52, the mobile segment 54, or both (as discussed below). The insulated joystick 20 may further comprise an interlock assembly 56 and a handguard 58.

Figure 4:
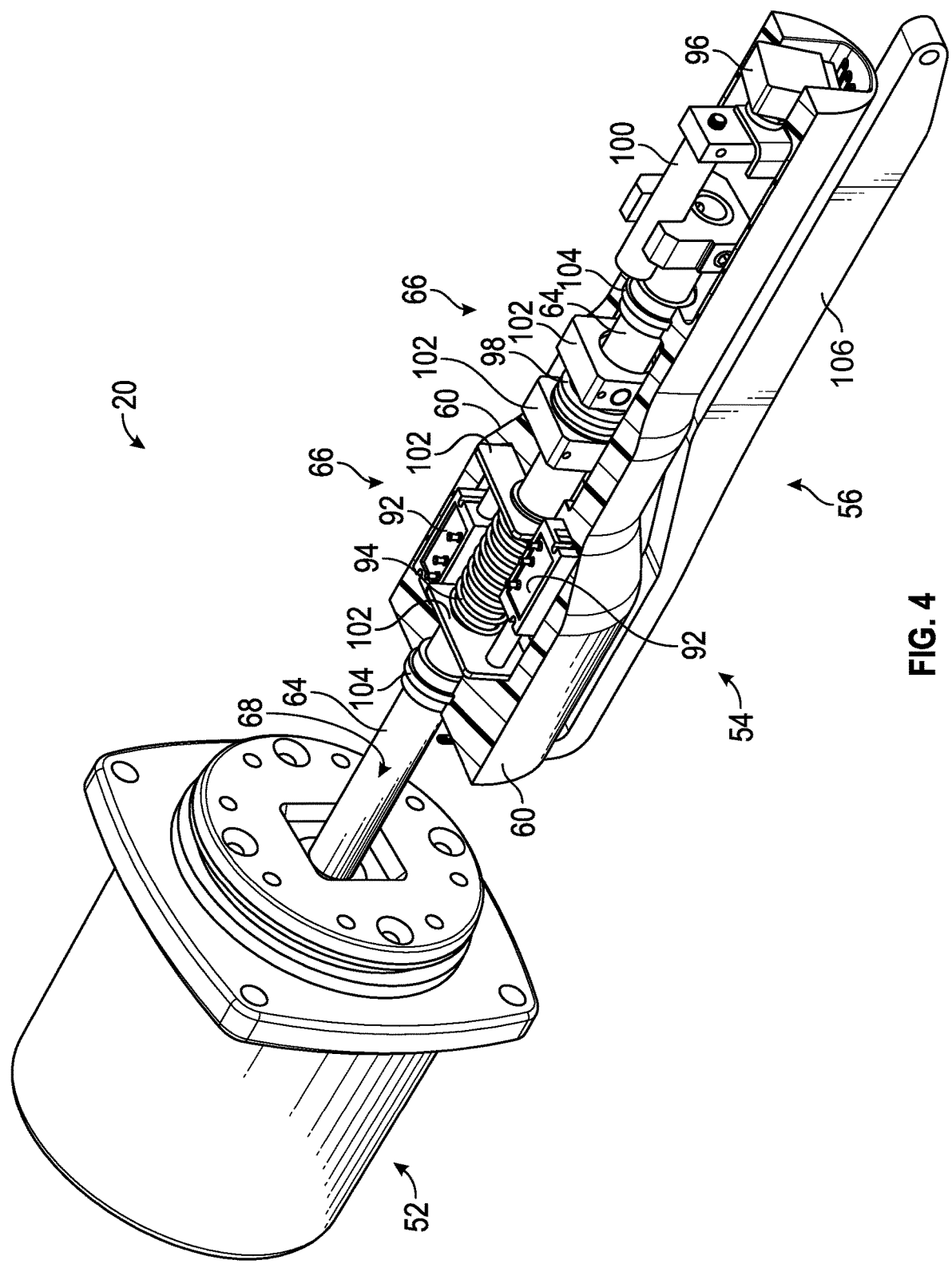
FIG. 4 is a perspective view of the insulated joystick of FIG. 3, shown with an outer protective segment removed to show interior components.
Figure 5:
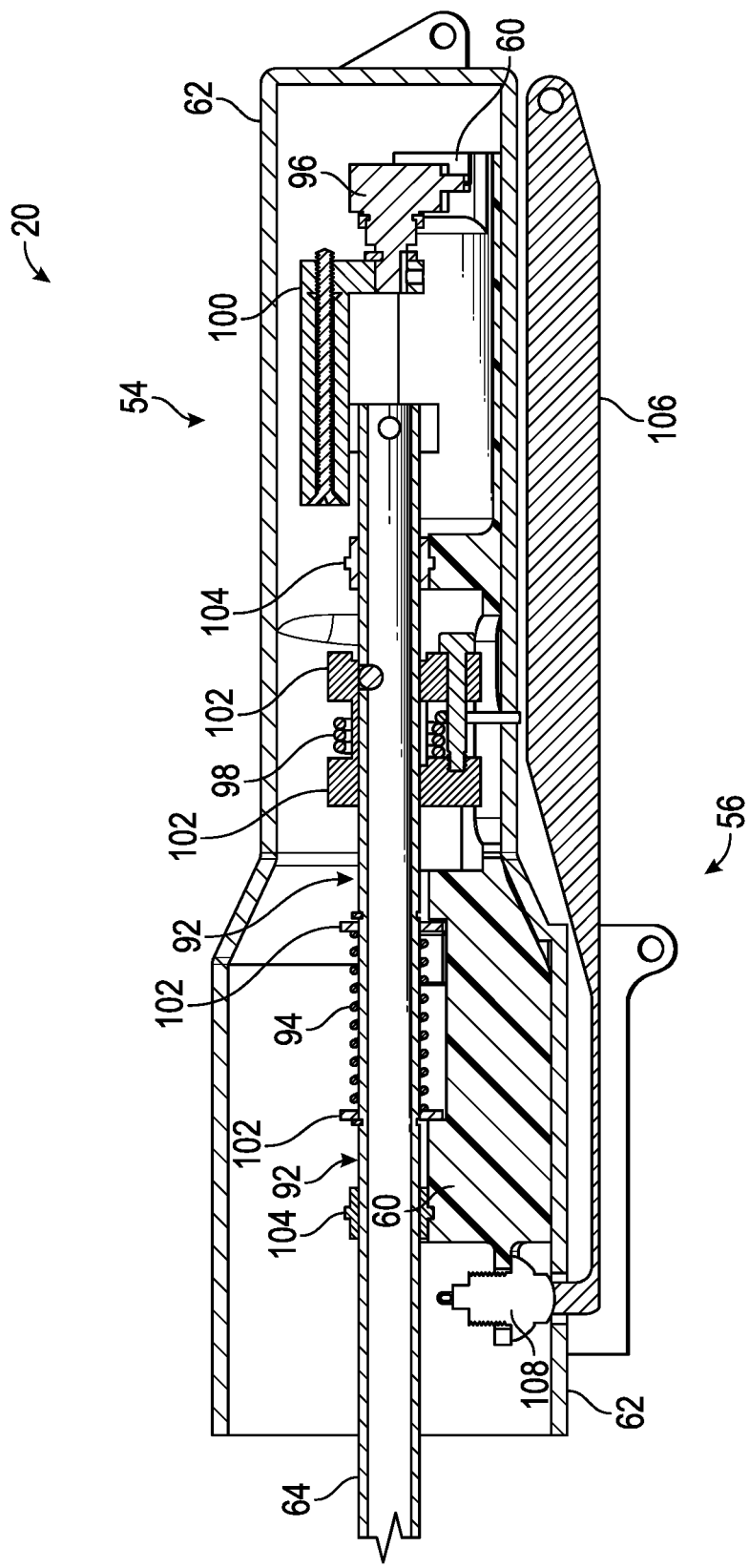
FIG. 5 is vertical cross-section view of the insulated joystick of FIG. 4.

In embodiments of the invention, the mobile segment 54 of the insulated joystick 20 comprises an inner assembly segment 60, an outer protective segment 62, a traversing rod 64 and at least one sensor 66. The traversing rod 64 is secured at a proximal end to the static segment 52, such that the traversing rod 64 may move relative to the static segment 52 in at least one degree of freedom, as best illustrated in FIG. 4. The inner assembly segment 60 is secured to a distal end 68 of the traversing rod 64. The inner assembly segment 60 has at least one sensor 66 secured therein for detecting movement. The outer protective segment 62 is disposed around the inner assembly segment 60 to prevent an electrical discharge through the sensors 66, as best illustrated in FIG. 5.

In embodiments of the invention, at least one sensor 66 in the static segment 52 detects the motion of the traversing rod 64 relative to the static segment 52 and at least one sensor 66 in the inner assembly detects motion of the inner assembly 13 segment 60 relative to the traversing rod 64. The at least one sensor 66 in the static segment 52 may be referred to as "static sensors" and the at least one sensor 66 in the inner assembly segment 60 may be referred to as "mobile sensors." The static sensors 66 therefore detect movement of the traversing rod 64 relative to the static segment 52, and the mobile sensors 66 detect movement of the inner assembly segment 60 relative to the traversing rod 64. It should be appreciated that static sensors 66 are electrically insulated from the operator's hand via physical separation (as they are located within the static segment 52). The mobile sensors 66 are electrically insulated from the operator's hand via the inner assembly segment 60 and the outer protective segment 62. In some embodiments, the mobile sensors 66 and their associated components are the only metallic components in the mobile segment 54. This allows the mobile segment 54 to remain physically small while providing insulative properties that protect the operator.

In embodiments of the invention, the inner assembly segment 60 and the outer protective segment 62 are each formed of a dielectric material. The dielectric material prevents a discharge of electricity through the mobile sensors 66. As opposed to the typical configuration of a metallic joystick being retrofitted with an insulative cover, the insulated joystick 20 of embodiments is fully insulated so as to provide maximum separation between the operator's hand and any metallic component. This increases safety for both the user and the electronic components.

In some embodiments of the invention, the insulated joystick 20 is configured to be installed in a set of upper boom controls 18 for an aerial device 10. In these embodiments, the insulated joystick 20 may be of a common size and shape of other joysticks (at least in the static segment 52). An operator or owner may then uninstall the existing joystick and install the insulated joystick 20 into the joystick mount 50. In other embodiments of the invention, the set of upper boom controls 18 and/or the utility platform assembly 16 is originally manufactured to include the insulated joystick 20. In these embodiments, the insulated joystick 20 may be included with the utility platform assembly 16 or the aerial device 10 that is purchased. In still other embodiments, the mobile segment 54 of the insulated joystick 20 is configured to be installed within an existing static segment 52. In these embodiments, the traversing rod 64 may be emplaced into the existing static segment 52 and secured thereto (or, alternatively, an existing traversing rod 64 may be inserted into the inner assembly segment 60).

The components of the insulated joystick 20 will now be discussed in more detail. As described above, the insulated joystick 20 of embodiments comprises the static segment 52 and the mobile segment 54. The mobile segment 54 of embodiments includes the inner assembly segment 60, the traversing rod 64, and the outer protective segment 62.

Figure 6:
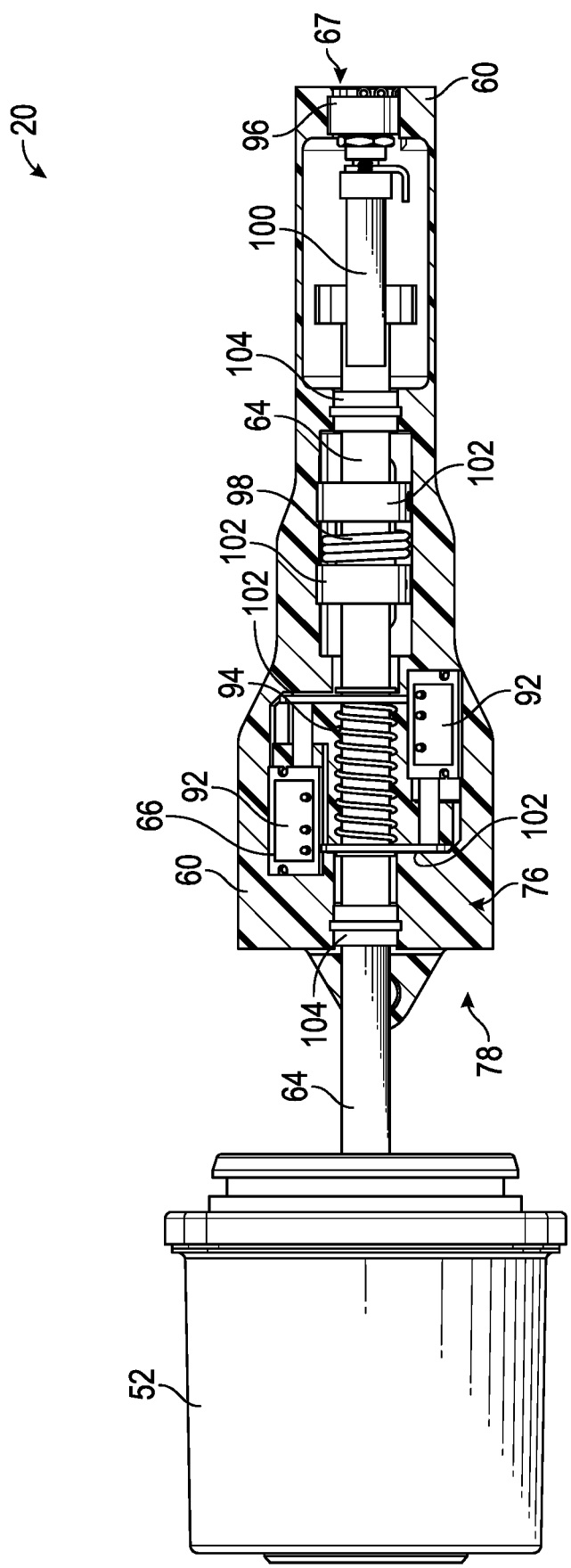
FIG. 6 is a top view of the insulated joystick of FIG. 4.
Figure 7:
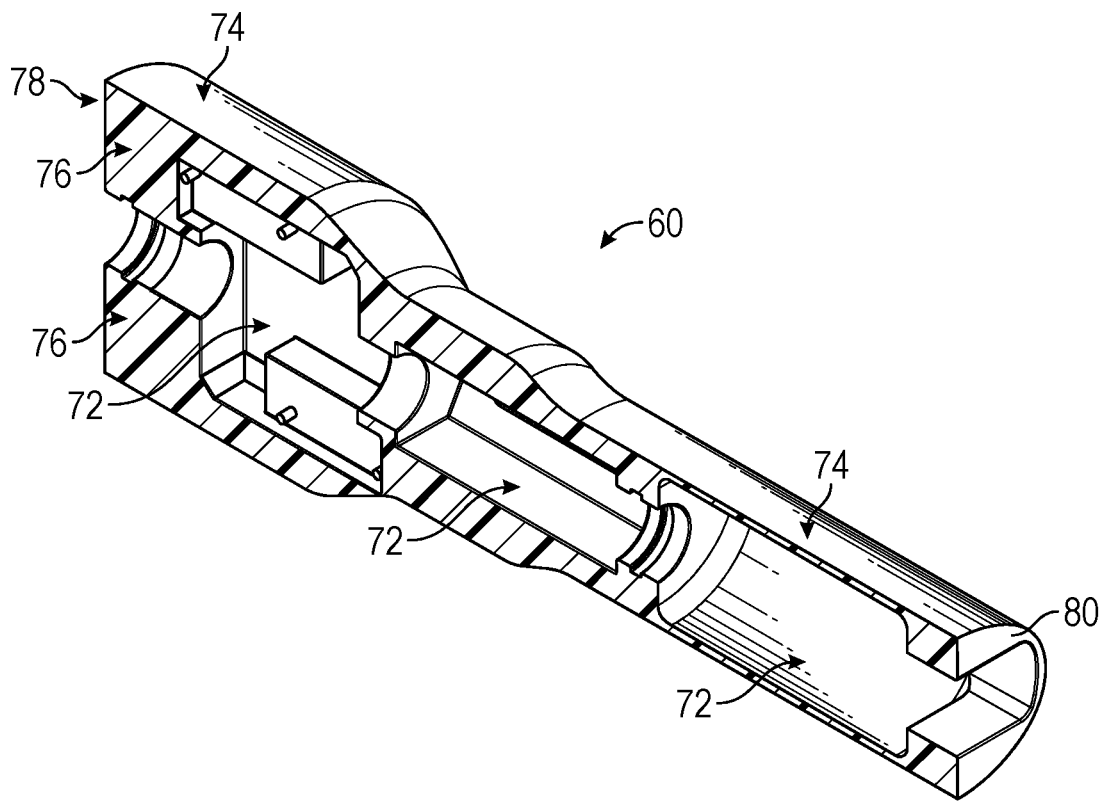
FIG. 7 is a perspective view of an inner assembly segment of the insulated joystick.

The inner assembly segment 60 presents a sensor void 72 for the receipt of at least one mobile sensor 66 therein (which may additionally or alternatively be referred to as an "interior sensor"), as best illustrated in FIGS. 6 and 7. The sensor void 72 may be of a certain size and shape so as to receive the mobile sensor 66 therein. Various mobile sensors 66, as described below, may require various size and shaped opening, based on the degrees of freedom through which they can move in addition to their stationary size and shape. The sensor void 72 may therefore include one or more recesses for each mobile sensor 66, the traversing rod 64, and other supporting hardware.

Figure 8:
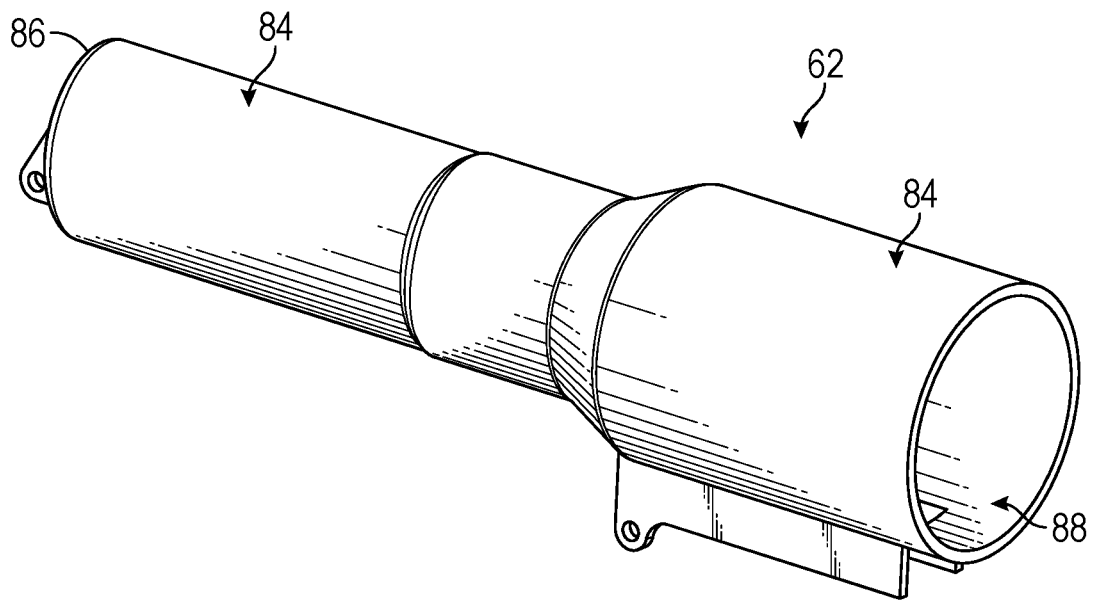
FIG. 8 is a perspective view of the outer protective segment.
Figure 9:
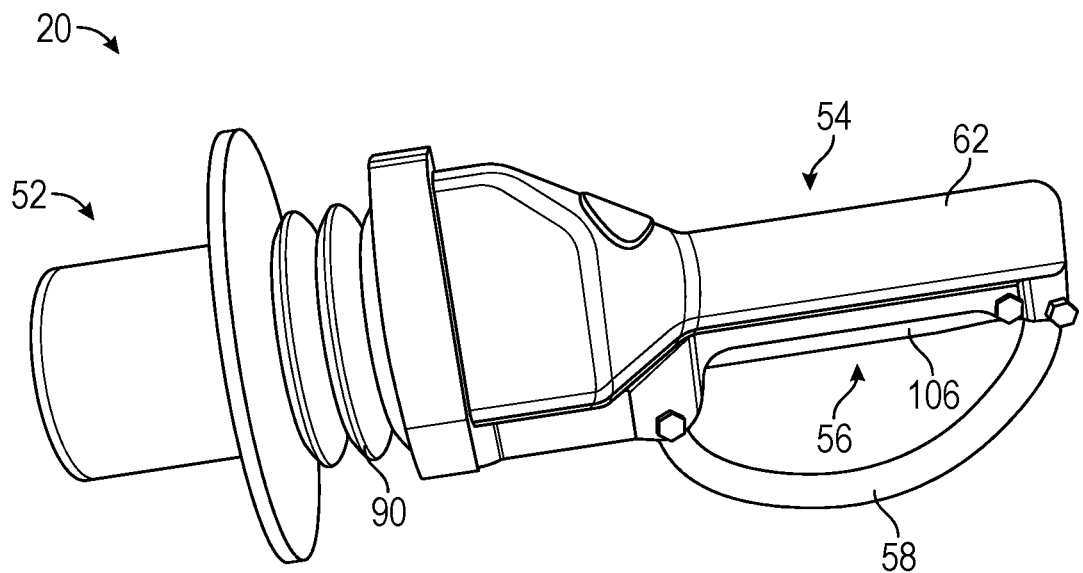
FIG. 9 is a perspective view of a second embodiment of the insulated joystick.

In embodiments of the invention, the inner assembly segment 60 is substantially semicylindrical. The semicylinder shape presents a rounded wall 74 (configured to be grasped indirectly by the user), a flat open side 76 (configured to have the traversing rod 64 and the mobile sensor 66 installed therein), a proximal endcap 78, and a distal endcap 80. In embodiments of the invention, the inner assembly segment 60 is formed of a dielectric material, as discussed above. As such, the mobile sensors 66 may be disposed directly within an insulated environment. In some embodiments of the invention, the inner assembly segment 60 is long enough to be grasped indirectly (e.g., through the outer protective segment 62) by the user, as illustrated in FIG. 3-8. In other embodiments of the invention, the inner assembly segment 60 is truncated such that the user grasps only the outer protective segment 62, as illustrated in FIGS. 9-10.

Figure 10:
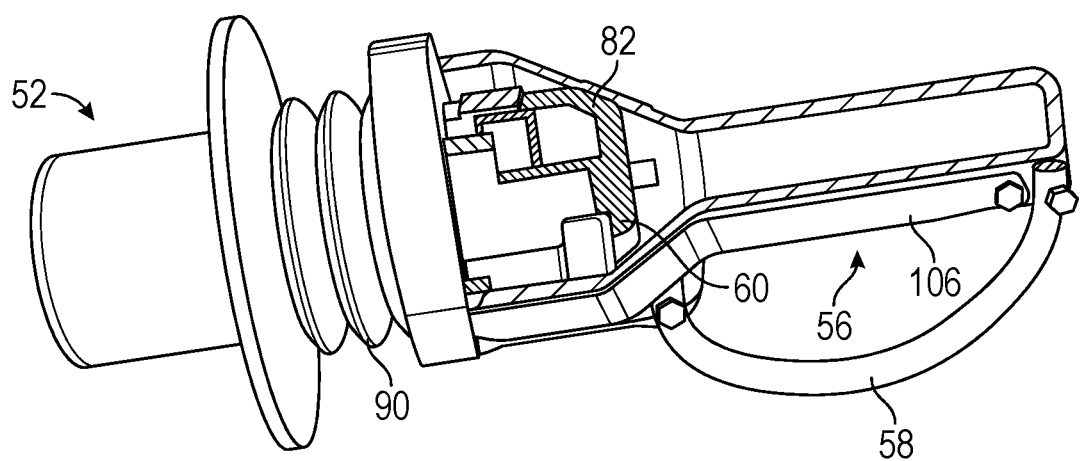
FIG. 10 is a perspective view of the insulated joystick of FIG. 9 with the outer protective segment removed.

In some embodiments, the inner assembly segment 60 may further comprise an inner protective segment 82, as illustrated in FIG. 10. The inner protective segment 82 is complementary to the inner assembly segment 60 (save for the sensor void 72). The inner protective segment 82 may therefore present a semicylinder shape that has a flat open side. The flat open side of the inner protective side is configured to fit against the flat open side of the inner assembly segment 60. The inner protective segment 82 is therefore configured to provide an additional layer of protection between the user's hand and the electronic sensors 66. In some embodiments, the inner assembly segment 60 does not include the inner protective segment 82, such as illustrated in FIG. 5. For example, if the outer protective segment 62 is sufficiently rigid and insulative, the inner protective segment 82 may not be needed.

The outer protective segment 62 is disposed at least partially around the inner assembly segment 60 (and, in embodiments of the invention, at least partially around the inner protective segment 82). The outer protective segment 62 is configured to be installed around the inner assembly segment 60 and the traversing rod 64. The outer protective segment 62 fully covers the mobile sensors 66 and at least a portion of the inner assembly segment 60. In embodiments of the invention, the outer protective segment 62 is a substantial cylinder shape. The cylinder shape presents a rounded wall 84, an end cap 86, and an open end 88. The open end 88, as best seen in FIG. 8, is configured to fit over the inner assembly segment 60 from the distal end. The outer protective segment 62 may then be secured to the inner assembly segment 60 via mechanical fixtures, mechanical fasteners, chemical adhesives, or other fastening structure (not illustrated). In embodiments of the invention, the outer protective segment 62 is formed of a dielectric material.

The traversing rod 64 disposed at least partially through or into the inner assembly segment 60. The traversing segment connects the static segment 52 to the mobile segment 54 of the insulated joystick 20. The traversing rod 64 pivots relative to a pivot point within the static segment 52. The movement of the traversing rod 64 relative to the static segment 52 is measured by the static sensors.

In embodiments of the invention, the traversing rod 64 is elongated so as to present a generally elongated cylinder shape. The elongated cylinder passes through at least a portion of the inner assembly segment 60 and at least a portion of the static segment 52. In some embodiments, the traversing rod 64 is formed of a metal. The traversing rod 64 may be formed of metal so as to ensure the traversing rod 64 retains its shape. The metal of which the traversing rod 64 is formed may also be detected by one or more sensor 66 (such as a static sensor 66, a mobile sensor 66, or both). In other embodiments, the traversing rod 64 is formed of a hardened polymer.

In embodiments of the invention, at least a portion of the traversing rod 64 disposed between the mobile segment 54 and the static segment 52 may have a flexible cover 90 thereon or thereabout, as shown in FIG. 9. The flexible cover 90 may be secured to the static segment 52, the mobile segment 54, or both. The flexible cover 90 prevents incidental contact to the traversing rod 64 by the operator's hand or other electrified source 24. In other embodiments, the mobile segment 54 and/or the static segment 52 may include a rigid protrusion (not illustrated).

The mobile sensors 66 will now be discussed in more detail. As described above, the mobile sensors 66 are disposed at least partially within the inner assembly segment 60. The mobile sensors 66 are installed into, around, near, or through the inner assembly segment 60. Each mobile sensor 66 is configured to detect a movement of the insulated joystick 20 by a user. Each mobile sensor 66 may detect movement about one or more degrees of freedom, as discussed above.

In embodiments of the invention, at least one mobile sensor 66 is a linear potentiometer 92, as illustrated in FIGS. 4-6. The linear potentiometer 92 is disposed at least partially within the inner assembly segment 60. The linear potentiometer 92 is configured to detect linear movement of the inner assembly segment 60 relative to the static segment 52. For example, the linear potentiometer 92 may measure forward-backward movement (relative to the above discussed reference frame) toward and/or away from the static segment 52.

In embodiments of the invention, the linear potentiometer 92 is associated with an axial centering spring 94. The axial centering spring 94 may be a spring or other actuator. The axial centering spring 94 provides a force against the inner assembly segment 60. The force tends to return the inner assembly segment 60 to a default linear position absent an exterior force. The axial centering spring 94 therefore keeps the inner assembly segment 60 (and by extension, the mobile sensors 66 and the outer protective segment 62) in the default linear position absent an outside force (such as the operators hand forcing toward or away from the static segment 52).

In embodiments of the invention, at least one mobile sensor 66 is a rotary potentiometer 96. The rotary potentiometer 96 is disposed at least partially within the inner assembly segment 60. The rotary potentiometer 96 is configured to detect rotational movement of the inner assembly segment 60 relative to the static segment 52. For example, the rotary potentiometer 96 may measure roll movement (relative to the above discussed reference frame) around the traversing rod 64.

In embodiments of the invention, the rotary potentiometer 96 is associated with a torsional centering spring 98. The torsional centering spring 98 may be a spring or other actuator. The torsional centering spring 98 provides a force against the inner assembly segment 60. The force tends to return the inner assembly segment 60 to a default rotary position absent an exterior force. The torsional centering spring 98 therefore keeps the inner assembly segment 60 (and by extension, the mobile sensors 66 and the outer protective segment 62) in the default rotary position absent an outside force (such as the operators hand forcing about the traversing rod 64).

In embodiments of the invention, the rotary potentiometer 96 is associated with a potentiometer-rod interface 100 that transfers rotational motion of the traversing rod 64 to the rotary potentiometer 96. The potentiometer-rod interface 100 is best illustrated in FIG. 4.

In embodiments of the invention the axial centering spring 94 and/or the torsional centering spring 98 are associated with a spring interface 102. The spring interface 102 exerts a force of the associated spring 94,98 and/or receives the force imparted by the associated spring 94,98. The spring interface 102 may be secured to, may be a component of, or be otherwise associated the inner assembly segment 60. The spring interface 102 may be a plate, a block, a notch, a protrusion, or other structure configured to interface with the associated spring 94,98 and/or the inner assembly segment 60.

In embodiments of the invention, the traversing rod 64 is associated with at least one bearing 104. In some embodiments, such as illustrated in FIG. 4, there are two bearings 104 disposed around the traversing rod 64. The bearings 104 facilitate the rotation and axial displacement of the inner assembly segment 60 relative to the traversing rod 64. The bearing 104 also keeps the inner assembly segment 60 aligned with the traversing rod 64.

The interlock assembly 56 will now be discussed in more detail. The interlock assembly 56 prevents movement of the utility platform assembly 16 unless the interlock assembly 56 is actuated. In embodiments of the invention, the interlock assembly 56 of the insulated joystick 20 includes an interlock actuator 106 and an interlock switch 108. The interlock actuator 106 is disposed below the inner assembly segment 60, as shown in FIGS. 4-5. The interlock switch 108 is configured to determine whether the interlock actuator 106 is actuated. In embodiments of the invention, the insulated joystick 20 only provides control commands to the utility platform assembly 16 and/or the boom assembly 14 while the interlock switch 108 detects that the interlock actuator 106 is actuated (e.g., the interlock actuator 106 is being gripped by the operator). This prevents incidental and unintended movement of the utility platform assembly 16 and the boom assembly 14 caused by brushing against the insulated joystick 20 (such as by the operator, equipment, parts, obstacles 22, trees, and the like). In some embodiments, the sensors 66 are only activated while the interlock switch 108 is actuated. In other embodiments, the sensor readings are only implemented if accompanied by a sensor reading from the interlock switch 108.

Various methods of the invention will now be discussed in greater detail. Embodiments of the invention are directed to a method of assembling an insulated joystick 20, the method comprising the following steps: inserting a traversing rod 64 at least partially into an inner assembly segment 60; inserting a mobile sensor 66 at least partially into the inner assembly segment 60, wherein the mobile sensor 66 is configured to detect movement of the inner assembly segment 60 relative to the traversing rod 64; and sliding an outer protective segment 62 at least partially over the inner assembly segment 60 so as to insulate the mobile sensor 66.

In some embodiments, the inner assembly segment 60 is configured to receive the outer protective segment 62 therearound by inserting the outer protective segment 62 over a distal end of the inner assembly. In some embodiments, the method further comprises the step of installing a proximal end 67 of the traversing rod 64 into a static segment 52, wherein the static segment 52 includes a static sensor 66 disposed within the static segment 52, wherein the traversing rod 64 is configured to interface with a static segment 52, wherein the static sensor is configured to detect movement of the traversing rod 64 relative to the static segment 52. The method may further comprise the step of installing the static segment 52 into a joystick mount 50 associated with a set of upper boom controls 18. In some embodiments, the inner assembly segment 60 is configured to receive the mobile sensor 66 into the sensor void 72 during assembly, and the inner assembly segment 60 is configured to receive the outer protective segment 62 therearound by inserting the outer protective segment 62 over a distal end of the inner assembly.

It should be appreciated that, while the above disclosure has been generally directed to the field of aerial devices, embodiments of the invention may be directed to other fields and uses. For example, embodiments of the invention may be used in stationary cranes, antennas, digger derricks, and other equipment that lifts off the ground from a stationary or selectively stationary location.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A four-axis insulated joystick comprising:
an inner assembly segment presenting a sensor void,
wherein the inner assembly segment is formed of a dielectric material;
a linear potentiometer disposed at least partially within the sensor void,
wherein the linear potentiometer is configured to detect a linear movement of the insulated joystick by a user;
an axial centering spring for returning the inner assembly segment to a default linear position absent an exterior force,
wherein the axial centering spring is disposed co-axially with a traversing rod of the insulated joystick;
a spring interface compressing the axial centering spring under force by the user and connected to the linear potentiometer,
wherein the linear potentiometer is disposed parallel to the axial centering spring,
wherein the axial centering spring, the spring interface, and the linear potentiometer are disposed within the inner assembly segment; and
an outer protective segment disposed at least partially around the inner assembly segment,
wherein the outer protective segment is placed over the inner assembly segment, the inner assembly segment is configured to receive the outer protective segment therearound by inserting the outer protective segment over a distal end of the inner assembly segment
wherein the outer protective segment is formed of a dielectric material so as to reduce a likelihood of an electrical discharge.

2. The insulated joystick of claim 1,
wherein the insulated joystick is configured to be installed in a set of upper boom controls for an aerial device,
wherein the set of upper boom controls is configured to control movement of the aerial device based at least in part on said detected movement of the insulated joystick.

3. The insulated joystick of claim 1,
wherein the traversing rod is disposed at least partially through the inner assembly segment,
wherein said detected movement of the insulated joystick is relative to the traversing rod and the inner assembly segment.

4. The insulated joystick of claim 3, further comprising:
a rotary potentiometer disposed at least partially within the inner assembly segment,
wherein the rotary potentiometer is configured to detect rotational movement of the inner assembly segment relative to the traversing rod.

5. The insulated joystick of claim 4, wherein the rotary potentiometer is associated with a torsional centering spring for returning the inner assembly segment to a default rotary position absent an exterior force.

6. The insulated joystick of claim 1, wherein the inner assembly segment is configured to receive the linear potentiometer into the sensor void during assembly.

7. The insulated joystick of claim 1, further comprising:
an interlock actuator disposed parallel to the inner assembly segment,
an interlock switch configured to determine whether the interlock actuator is actuated.

8. An aerial device comprising:
a base;
a boom assembly presenting a proximal end and a distal end,
wherein the boom assembly is pivotably secured to the base at the proximal end;
a utility platform assembly pivotably secured to the distal end of the boom assembly; and
an insulated joystick configured to control movement of the utility platform assembly and the boom assembly,
said insulated joystick comprising:
an inner assembly segment presenting a sensor void,
wherein the inner assembly segment is formed of a dielectric material;
a linear potentiometer disposed at least partially within the sensor void,
wherein the linear potentiometer is configured to detect a linear movement of the insulated joystick by a user;
an axial centering spring for returning the inner assembly segment to a default linear position absent an exterior force,
wherein the axial centering spring is disposed co-axially with a traversing rod of the insulated joystick;
a spring interface compressing the axial centering spring under force by the user and connected to the linear potentiometer,
wherein the linear potentiometer is disposed parallel to the axial centering spring,
wherein the axial centering spring, the spring interface, and the linear potentiometer are disposed within the inner assembly segment; and
an outer protective segment disposed at least partially around the inner assembly segment,
wherein the outer protective segment is placed over the inner assembly segment, the inner assembly segment is configured to receive the outer protective segment therearound by inserting the outer protective segment over a distal end of the inner assembly segment
wherein the outer protective segment is formed of a dielectric material so as to reduce a likelihood of an electrical discharge.

9. The aerial device of claim 8,
wherein the insulated joystick is installed in a set of upper boom controls of the utility platform assembly,
wherein the set of upper boom controls is configured to control movement of the aerial device based at least in part on said detected movement of the insulated joystick.

10. The aerial device of claim 8,
wherein the traversing rod is disposed at least partially through the inner assembly segment,
wherein said detected movement of the insulated joystick is relative to the traversing rod and the inner assembly segment.

11. The aerial device of claim 10, further comprising:
a rotary potentiometer disposed at least partially within the inner assembly segment, wherein the rotary potentiometer is configured to detect rotational movement of the inner assembly relative to the traversing rod,
wherein the rotary potentiometer is associated with a torsional centering spring for returning the inner assembly segment to a default rotary position absent an exterior force.

12. A four-axis insulated joystick comprising:
an inner assembly segment presenting a sensor void,
wherein the inner assembly segment is formed of a dielectric material;
a linear potentiometer disposed at least partially within the sensor void,
wherein the linear potentiometer is configured to detect a linear movement of the insulated joystick by a user;
an axial centering spring for returning the inner assembly segment to a default linear position absent an exterior force,
wherein the axial centering spring is disposed co-axially with a traversing rod of the insulated joystick;
a spring interface compressing the axial centering spring under force by the user and connected to the linear potentiometer, wherein the linear potentiometer is disposed parallel to the axial centering spring, wherein the axial centering spring, the spring interface, and the linear potentiometer are disposed within the inner assembly segment; and
an outer protective segment disposed at least partially around the inner assembly segment,
wherein the outer protective segment is placed over the inner assembly segment, the inner assembly segment is configured to receive the outer protective segment therearound by inserting the outer protective segment over a distal end of the inner assembly segment
wherein the outer protective segment is formed of a dielectric material so as to reduce a likelihood of an electrical discharge.

13. The insulated joystick of claim 12,
further comprising a static segment receiving a proximal end of the traversing rod;
wherein the static segment includes a static sensor disposed within the static segment,
wherein the traversing rod is configured to interface with the static segment,
wherein the static sensor is configured to detect movement of the traversing rod relative to the static segment.

14. The insulated joystick of claim 12, further comprising a rotary potentiometer disposed at least partially within the inner assembly segment, wherein the rotary potentiometer is configured to detect rotational movement of the inner assembly segment relative to the traversing rod.

15. The insulated joystick of claim 14, wherein the rotary potentiometer is associated with a torsional centering spring for returning the inner assembly segment to a default rotary position absent an exterior force.

16. The insulated joystick of claim 12, wherein the linear potentiometer is a first linear potentiometer; and a second linear potentiometer is disposed within the inner assembly segment.

17. The insulated joystick of claim 16, wherein the second linear potentiometer is disposed parallel to the axial centering spring on a side of the axial centering spring opposite the first linear potentiometer.

18. The insulated joystick of claim 12,
wherein the insulated joystick is disposed in a set of upper boom controls of a utility platform assembly,
wherein the set of upper boom controls is configured to control movement of an aerial device based at least in part on said detected movement of the insulated joystick.

19. The insulated joystick of claim 12, further comprising:
an interlock actuator disposed parallel to the inner assembly segment, and
an interlock switch configured to determine whether the interlock actuator is actuated.

* * * * *